United States Patent

Mattuschka

[11] 4,114,062
[45] Sep. 12, 1978

[54] THICKNESS SHEAR RESONATOR FOR USE AS AN OVER-TONE QUARTZ CRYSTAL

[75] Inventor: Werner Mattuschka, Munich, Germany

[73] Assignee: Siemens Aktiengesellschaft, Berlin and Munich, Germany

[21] Appl. No.: 830,046

[22] Filed: Sep. 2, 1977

[30] Foreign Application Priority Data

Sep. 15, 1976 [DE] Fed. Rep. of Germany ....... 2641571

[51] Int. Cl.² .............................................. H01L 41/10
[52] U.S. Cl. ................................... 310/326; 310/320; 310/353; 310/365; 310/368; 310/369
[58] Field of Search ............... 310/320, 360, 361, 365, 310/368, 369, 326, 353

[56] References Cited

U.S. PATENT DOCUMENTS

| 2,306,909 | 12/1942 | Sykes | 310/361 |
| 3,382,381 | 5/1968 | Horton | 310/365 X |
| 3,401,276 | 9/1968 | Curran et al. | 310/365 X |
| 3,684,905 | 8/1972 | Martyn | 310/361 X |
| 3,745,385 | 7/1973 | Nakajima et al. | 310/365 X |
| 3,792,294 | 2/1974 | Royer | 310/361 |

*Primary Examiner*—Mark O. Budd
*Attorney, Agent, or Firm*—Hill, Gross, Simpson, Van Santen, Steadman, Chiara & Simpson

[57] ABSTRACT

A thickness shear resonator used as an overtone quartz crystal for a quartz stabilized oscillator which has an operating frequency in the MHz range that has an excitation electrode on each of its plane parallel surfaces running in the $x$, $z'$ plane and where the thickness of the vibrator in the $y'$ direction is determined by the distance of these surfaces from one another wherein the vibrator presents a dimensional ratio between its dimensions measured in the $z'$ direction and its thickness which is determined by a fundamental quartz crystal frequency having a value of ⅓ of the operating frequency, thus, resulting in an oscillator which is not sensitive to influences from associated oscillating components.

6 Claims, 4 Drawing Figures

THICKNESS SHEAR RESONATOR FOR USE AS AN OVER-TONE QUARTZ CRYSTAL

BACKGROUND OF THE INVENTION

1. Field of the Invention

This invention relates in general to a thickness shear resonator for a quartz stabilized oscillator.

2. Description of the Prior Art

Generally, as compared with fundamental quartz crystals, the overtone quartz crystals have a higher temporal frequency stability and are less sensitive to influences coming from associated components of the oscillation circuit. Thus, these are preferably used for applications where fairly exacting requirements are required.

SUMMARY OF THE INVENTION

This invention relates to a thickness shear resonator which is used as an overtone quartz crystal for a quartz stabilized oscillator having an operating frequency in the MHz range which has an excitation electrode on each of its plane parallel surfaces lying in the $x$, $z'$ planes and in which the thickness of the vibrator in the $y'$ direction is determined by the distance between these surfaces.

Generally, when using overtone quartz crystals, one needs additional selecting means so as to be able to filter out the desired higher harmonics of the quartz crystal when the quartz crystal is to be operated with aperiodic oscillation circuit, for example.

However, such additional selection elements largely eliminate the saving and space that is obtained in such oscillation circuit as, for example, in modern integrated circuit technology.

It is an object of the present invention therefore, to provide a thickness shear resonator wherein it can be operated with an aperiodic oscillation circuit without requiring additional selection means.

The present invention is based on the knowledge that it is possible by producing a vibrator having particular dimensions to make the vibrator excitable in the desired harmonic mode alone. In particular, this design of oscillating quartz crystal ensures adequate suppression of the fundamental frequency or the fundamental frequency and the third harmonic when the quartz crystal is to be used with the third or fifth harmonics.

In the present invention, a particular advantage can also be obtained using quartz crystals which have dimensions in the direction $x$ that are different from that in the transverse direction $z'$ which allow, for example, the quartz crystal dimensions to be adjusted with relatively high operating frequencies by appropriate choice of $\beta$ ($\beta = x/z'$ ratio) so that the quartz crystal can be inserted in the retaining holders with the distance between which is often fixed to a greater or lesser degree with relatively small amount of complexity in mass production, for example. By selecting $\beta$ to equal 0.3, for example, the dimensions of the quartz crystal in the direction $z'$ can be made considerably larger than in direction $x$ and also greater than it would be in the case of a round or square quartz crystal without the selection function according to the teachings of the present invention being impared as a result.

For further improvement of the selection function of the quartz crystal, provision is also made that the dimension of the electrodes in the direction $z'$ to be chosen so that for a quartz crystal operating frequency which is three times greater than the fundamental crystal frequency, it is some 14 to 18 times larger than the vibrator thickness and for an operating frequency 5 times greater than the fundamental crystal frequency 6 to 10 times larger such that the electrode dimension in the direction $x$ is at most equal to that in the direction $z'$ and has a value of at least 0.5 . 1$x$. Whereas 1$x$ is the dimension of the vibrator in the direction $x$ and such that the electrode mass is such that the frequency difference $\Delta f$ between the oscillation frequency of the vibrator having electrodes and that of the vibrator without the electrodes relative to the operating frequency is $\alpha$ $(k/n \cdot \epsilon)^2$ in which $\alpha$ has the value 1.3 to 1.6, $k$ has the value of 2.4 and $\epsilon$ the value of 14 to 18 with $n$ equals 3, in other words, representing the third harmonic and the value 6 to 10 with $n$ equal 5, in other words, for the fifth harmonic.

The rules governing the size of the electrode mass in particular offers a very simple guide on how to start from the frequency at which the crystal will vibrate even though the crystal has not yet been provided with electrodes which is called the bare quartz crystal. By appropriate vapor deposition, for instance, of electrode material on the quartz crystal the oscillation frequency of the quartz crystal can be lowered until it vibrates at the required operating frequency. The electrode material applied to the quartz crystal in this way then automatically provides the value necessary for suppressing undesired oscillations of the quartz crystal.

In a further extension of the invention, provision can also be made for retaining holders provided to support the vibrator to be furnished in the case of a vibrator the dimensions of which are the same in the $x$ and $z'$ directions on the vibrator in each case at the points where the line of symmetry of the vibrator running in the direction $x$ intersects the edge of the vibrator and for the retaining members in which the vibrator is to be mounted in the case of a vibrator the dimensions of which in the $x$ direction are different from that in the $z'$ direction such that in each case at the points where the line of symmetry of the vibrator running in the $z'$ direction intersects the edge of the vibrator and for damping materials to be mounted in dot or line form on the vibrator outside of the electrodes in the vicinity of the edge of the vibrator.

By selecting the bearing points on a quartz crystal for the retaining members, the tuning of the quartz crystal with regard to the third or fifth harmonic is further promoted. The additional application of damping material in dot or line form is not essential to the invention but it can contribute to further suppression of undesired oscillation modes in many cases.

Other objects, features and advantages of the invention will be readily apparent from the following description of certain preferred embodiments thereof taken in conjunction with the accompanying drawings although variations and modifications may be effected without departing from the spirit and scope of the novel concepts of the disclosure and in which:

DESCRIPTION OF THE PREFERRED EMBODIMENTS

Assume that a quartz stabilized aperiodic oscillation circuit which is not shown is to be operated at a frequency of 24 MHz.

The quartz crystal for this oscillation circuit is used as an overtone quartz crystal so as to exploit the advantages obtainable such as high temporal frequency stability, reduced circuit influence on the quartz crystal. Additional selection means for filtering out the desired harmonic oscillation need not be provided with the invention.

First the thickness of the vibrator, in other words, its dimension in the direction $y'$ relative to the Figures is obtained from the known relationship $d \simeq N/f$ in which the frequency of the fundamental oscillation is selected in kHz is inserted for the value for $f$ and the value of 1670 kHz mm for N.

If, for example, the third harmonic of the quartz crystal is chosen as the harmonic operating frequency, this gives a fundamental quartz crystal frequency of $24/3 \cdot 10^3$ kHz $= 8 \cdot 10^3$ kHz. This calculates that the vibrator thickness is equal to 0.21 mm.

Figure 3:
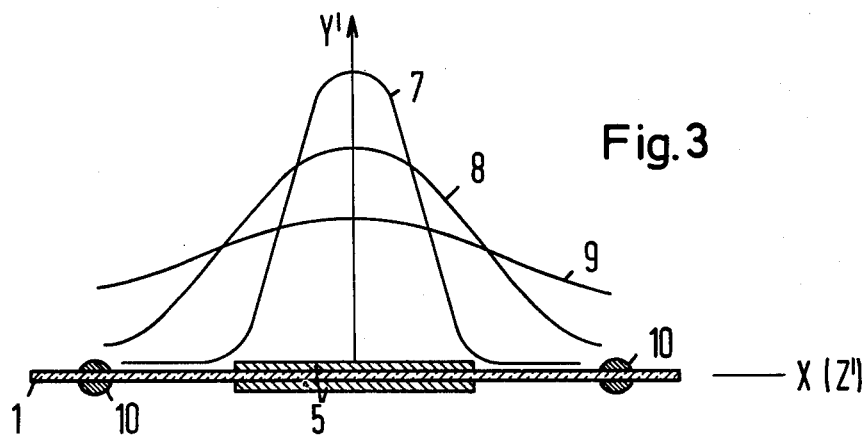
FIG. 3 is a sectional view through a quartz crystal disc with the amplitude spread for the fifth and third harmonics and the fundamental oscillation frequency illustrated relative to the disc.

When the vibrator is in the form of a round disc shaped quartz crystal such as shown in FIG. 3 and designated by 1 having a $\beta = 1$ with a selected dimension ratio of 20 (generally, the dimension ratio is optionally selected between 20 and 30) the result is a crystal length of 4.2 mm in directions both $x$ or $z'$ which is obtained from the relationship $1z'/d \geqq 20/\sqrt{\beta}$ where $\beta$ is equal to 1 and the selection of 20 as the dimension ratio between the length of the quartz crystal in direction $z'$ ($1z'$) and its thickness $d$.

Figure 2A:
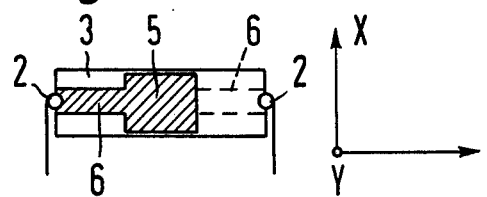
FIGS. 2$a$ and 2$b$ illustrate a pair of oscillation crystals which are shorter in one dimension than they are in the transverse dimension.
Figure 2B:
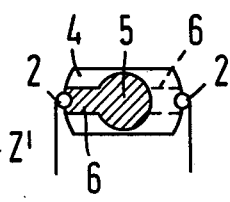

With the vibrator constructed so that it is shorter in the $x$ direction as illustrated in FIGS. 2a and 2b than in the $z'$ direction, with $\beta$ chosen to be equal to 0.55 — a value for $\beta$ lying within the range from 0.3 to 1.0 $z'$ will be 5.6 mm and the dimension in the $x$ direction will be 3.1 mm from the equation $\beta \cdot 1z'$.

Figure 1:
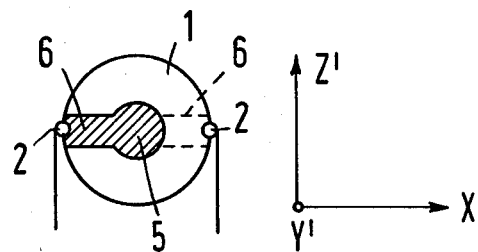
FIG. 1 is a top plan view of a disc shaped oscillator.

The electrodes both for the round disc shaped crystal illustrated in FIG. 1 and the quartz crystals 3 and 4 having shorter dimension in the $x$ direction as illustrated in FIGS. 2a and 2b should be of such a size that the electrodes extend to a breadth of about 2.9 mm in the $z'$ direction and in the $x$ direction. It is desirable that the electrode dimension in the $z'$ direction should be such that they have a ratio of the order of 14 to 18 of the vibrator thickness and the factor 14 was chosen in the example embodiment illustrated.

The frequency of the bare quartz crystal must be selected so as to be about 120 kHz $= \Delta f$ higher than the desired operating frequency of 24 MHz according to the equation $\Delta f = f_B \cdot a(k/n \cdot \epsilon)^2$ in which the experimentally determined value for $a$ lies between 1.3 and 1.6 and in the present preferred embodiment the value of 1.5 was chosen for $a \cdot k$ is the material constant and has the value of 2.4. $\epsilon$ is the number indicating the ratio between the electrode dimension in the $z'$ direction and the vibrator thickness and can be between the values of 14 to 18 wherein $n$ is equal 3 and in the selected embodiment $\epsilon$ had a value of 14. With a value of $n = 5$ the value of $\epsilon$ should be 6 to 10. $n$ represents the ordinal harmonic of the oscillating quartz crystal at which the quartz crystal is to be operated and in the present example, $n$ had a value of 3. The oscillating frequency of the quartz crystal is lowered to the operating frequency by the electrode material which is applied to the bare quartz crystal, as for example, by vapor deposition.

The electrode material which is applied onto the quartz crystal automatically assumes the optimum value.

The above dimensions produced a quartz vibrator operating as a thickness shear resonator which can only be excited in the third harmonic with a frequency of 24 MHz and, thus, can be operated with the aperiodic oscillation circuit without the use of any selecting means.

The rectangular or oval quartz crystals 3 and 4 shown respectively in FIGS. 2a and 2b can be preferentially used when the larger dimension of the quartz crystal in direction $z'$ obtainable ensures more favorable matching of quartz crystals and the distance between the retaining holders 2 than would have been the case with a round disc shaped quartz crystal oscillating at the same frequency.

FIG. 3 illustrates the oscillation amplitude above a cross-section through a quartz crystal disc 1 for the fifth harmonic illustrated by curve 7 and for the third harmonic illustrated by the curve 8 and illustrates the fundamental oscillation by the curve 9 over dimensions $x$ or $z'$ of the quartz disc with opposing electrodes 5 that are shown with exaggerated thickness. The electrodes 5 are connected as shown in FIGS. 1 and 2a and 2b electrically to the retaining holders 2 by means of conducting strips 6 (the strips and retaining members are not illustrated in FIG. 3). It should be observed that in contrast to the embodiments of the example, above, that the dimensions are chosen so that the fifth harmonic is the same as the operating frequency.

It can be observed in the embodiment of FIG. 3 that the additional application of damping material 10 at points near the outer edges as illustrated in FIG. 3 suppress the formation of the fundamental oscillation and the third harmonic in particular. On the other hand, the amplitude of the fifth harmonic which is the operating frequency is essentially fully damped out in the area of the damping material and, thus, the fifth harominc remains unaffected by the damping measures and the damping material strongly reduces the third harmonic.

It is seen that this invention provides a new and novel thickness shear resonator and although it has been described with respect to preferred embodiments it is not to be so limited as changes and modifications may be made which are within the full intended scope as defined by the appended claims.

I claim as my invention:

1. A thickness shear resonator used as an overtone quartz crystal for a quartz stabilized oscillator with an operating frequency in the MHz range that has an excitation electrode on each of its plane-parallel surfaces running in plane $x$, $z'$ and in which the thickness of the vibrator in direction $y'$ is determined by the distance of the plane-parallel surfaces from each other characterized in that the vibrator (1, 3, 4) presents a dimensional ratio between its dimension measured in the $z'$ direction and its thickness having a value which lies in the range between $20/\sqrt{\beta}$ and $30/\sqrt{\beta}$ with a value for the thickness of the vibrator (1, 3, 4) determined by a fundamental quartz crystal frequency which has a value of $\frac{1}{3}$ of the operating frequency, and a dimensional ratio of about $12/\sqrt{\beta}$ with a value for the thickness of the vibrator determined by a fundamental quartz crystal frequency which has a value of 1/5 of the operating frequency, $\beta$ being the ratio of the vibrator dimension in the x direction to that in the z' direction and having a value in the range of 0.3 to 1.0.

2. A thickness shear resonator as in claim 1, characterized in that the electrode dimension measured in the z' direction is chosen so that when the operating frequency of the quartz crystal is three times greater than the fundamental frequency of the quartz crystal it is 14 to 18 times greater than the vibrator thickness and when the operating frequency is five times greater than the fundamental frequency of the quartz crystal it is 6 to 10 times greater.

3. A thickness shear resonator as in claim 2 characterized in that at most the electrode dimension in direction x is the same as that in direction z' and exhibits at least the value $0.5 \cdot 1x$, with $1x$ being the dimension of the vibrator in the x direction.

4. A thickness shear resonator as in claim 3 characterized in that the electrode mass is such that the frequency difference $\Delta f$ between the oscillation frequency of the vibrator provided with excitation electrodes and that of the vibrator without electrodes relative to the operating frequency is $\alpha (k/n \cdot \epsilon)^2$ in which $\alpha$ has a value of 1.3 to 1.6, $k$ the value 2.4 and $\epsilon$ the value of about 14 to 18 for $n = 3$, i.e. for the third harmonic, and the value of about 6 to 10 for $n = 5$, i.e. for the fifth harmonic.

5. A thickness shear resonator as in claim 1 characterized in that retaining members (2) provided to support the vibrator are located in the case of a vibrator (1) which has the same dimensions in the x direction as that in the z' direction at the points on the vibrator where the line of symmetry of the vibrator runs in the x direction intersects the edge of the vibrator and in that in the case of a vibrator which has different dimensions in the x direction than in the z' direction, the retaining members (2) are disposed on the vibrator (3, 4) at points where the line of symmetry of the vibrator which run in the z' direction intersects the edge of the vibrator.

6. A thickness shear resonator as in claim 1 characterized in that damping material (10) is secured to the vibrator (1, 3, 4) in dot or line form away from the electrodes (5) in the vicinity of the edges of the vibrator.

* * * * *